United States Patent [19]
Lau

[11] Patent Number: 5,014,228
[45] Date of Patent: May 7, 1991

[54] METHOD AND APPARATUS FOR CALIBRATING LINEAR DELAY LINES

[75] Inventor: Hung-Wah A. Lau, Los Altos, Calif.

[73] Assignee: Schlumberger Technologies, Inc., San Jose, Calif.

[21] Appl. No.: 410,763

[22] Filed: Sep. 21, 1989

[51] Int. Cl.⁵ .......................................... G01R 35/00
[52] U.S. Cl. ................... 364/571.01; 341/120
[58] Field of Search ............. 364/571.01; 341/120, 341/121, 169

[56] References Cited

U.S. PATENT DOCUMENTS

| | | | |
|---|---|---|---|
| 3,685,048 | 8/1972 | Pincus | 341/120 |
| 3,750,142 | 7/1973 | Barnes et al. | 341/120 |
| 4,118,698 | 10/1978 | Becker | 341/120 |
| 4,222,107 | 9/1980 | Mrozowski et al. | 341/120 |
| 4,613,950 | 9/1986 | Knierim et al. | 341/120 |
| 4,827,437 | 5/1989 | Blanton et al. | 364/571.01 |
| 4,851,838 | 7/1989 | Shier | 341/121 |

FOREIGN PATENT DOCUMENTS 1273427  11/1989  Japan .................. 341/120

*Primary Examiner*—Salvatore Cangialosi
*Attorney, Agent, or Firm*—Townsend and Townsend

[57] ABSTRACT

A circuit for calibrating linear delay lines wherein a periodic ramp voltage is counted a fixed number of times at first and second frequencies. While the ramp voltages are being counted at each frequency, system clock pulses are counted. The number of system clock pulses counted for each first and second ramp voltage frequency is used to adjust the charging current applied to an integrator which establishes the delay value.

33 Claims, 3 Drawing Sheets

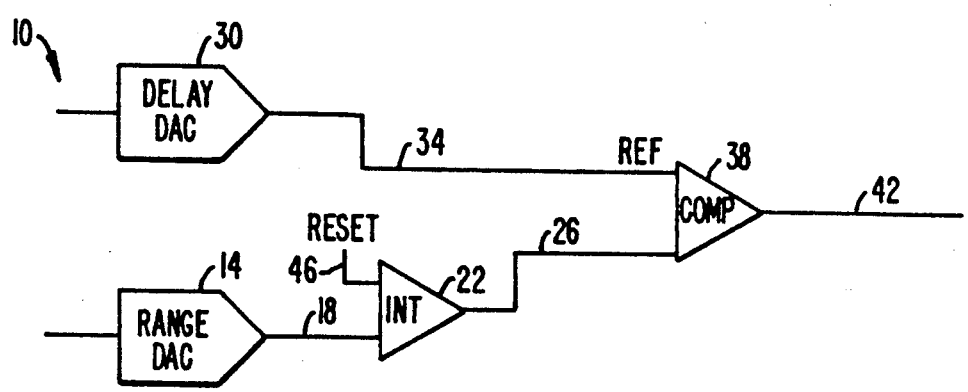
FIG._1.
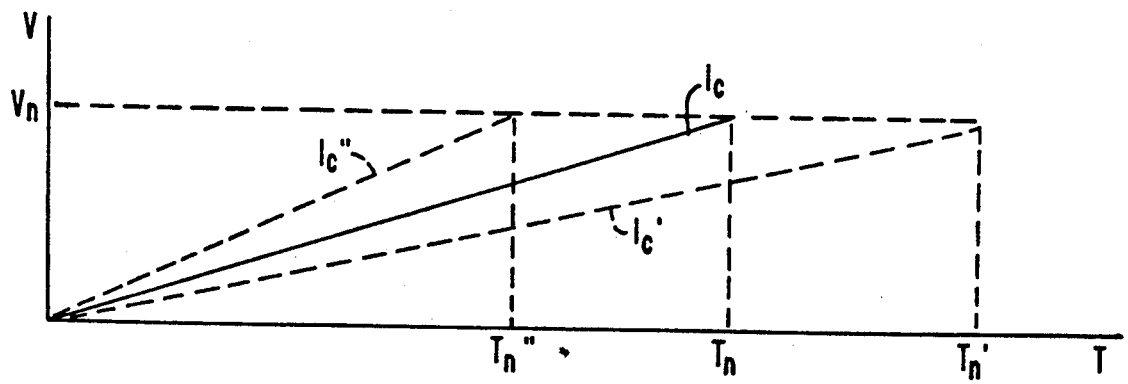
FIG._2.

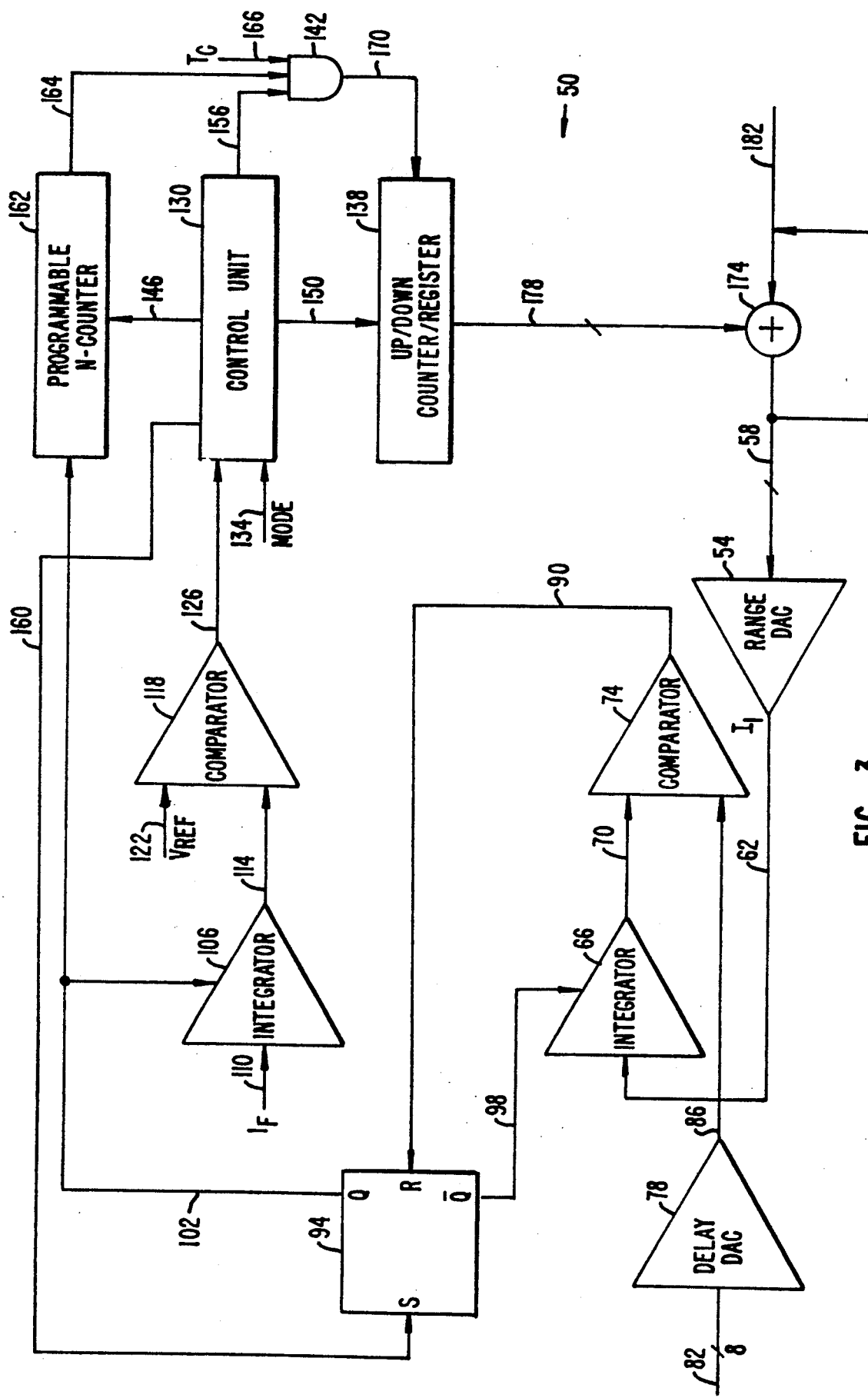
FIG._3.

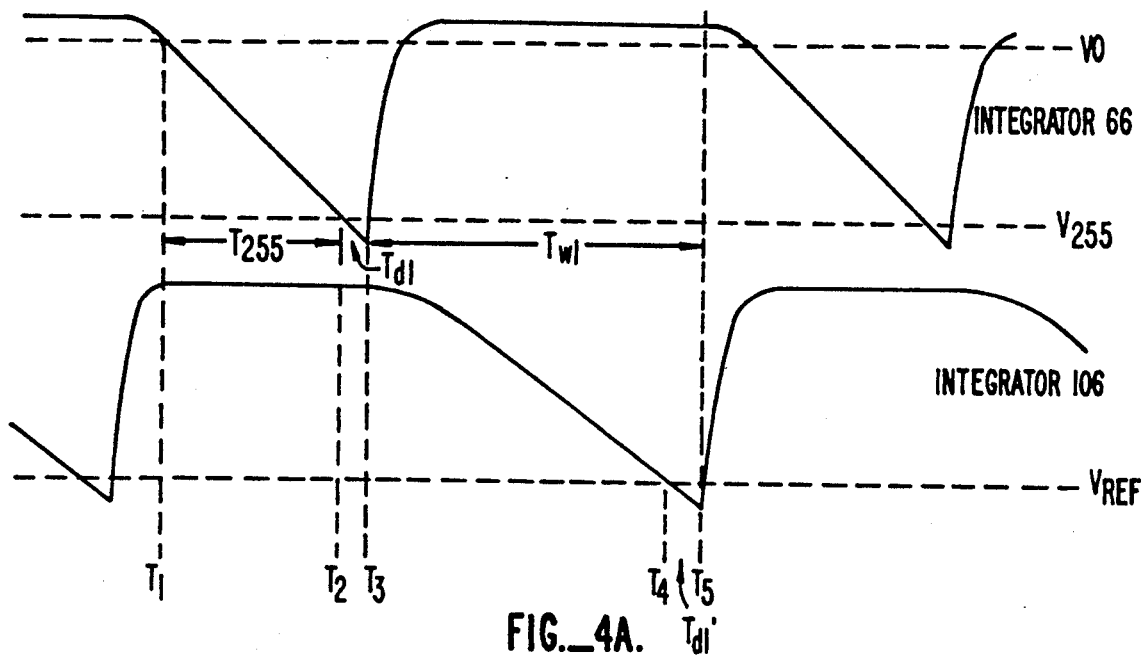
FIG._4A.
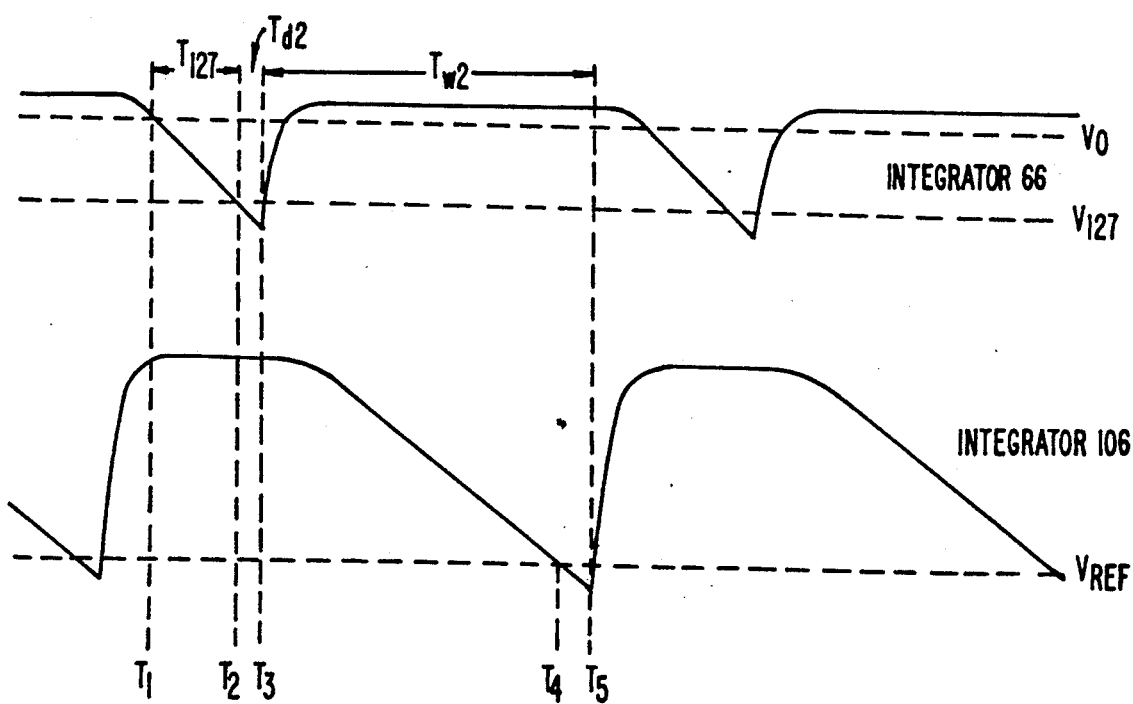
FIG._4B.

METHOD AND APPARATUS FOR CALIBRATING LINEAR DELAY LINES

BACKGROUND OF THE INVENTION

1. Field of the Invention

This invention relates to electronic testing devices and, more particularly, to a method and apparatus for calibrating linear delay lines in a VLSI tester.

2. Description of the Related Art

When testing integrated circuits, the time marker signals which are used to form the test signals must be accurately placed within prescribed time intervals. The time intervals typically comprise the periods of a system clock signal. It is not uncommon to find system clock periods on the order of 3.2 nanoseconds, and this frequently results in a required marker placement resolution on the order of picoseconds.

Because of the magnitude of the required resolution, it is usually necessary to employ linear delay lines rather than gated digital circuits for marker placement. Such a delay line is illustrated in FIG. 1. As shown in FIG. 1, a delay circuit 10 comprises a range digital-to-analog converter (DAC) 14 for converting a digital word into a charging current on a line 18; an integrator 22 for converting the current on line 18 into a ramp voltage on line 2610; a delay DAC 30 for converting a digital word into a reference voltage on a line 34; and a comparator 38 for comparing the range voltage on line 26 with the reference voltage on line 34 and for producing a signal on a line 42 when the range voltage matches the reference voltage. Once the range voltage matches the reference voltage, integrator 22 may be reset by signals applied to a reset line 46.

Operation of delay circuit 10 may be understood by referring to FIG. 2. Delay DAC 30 produces a voltage $V_n$ on line 34, and range DAC 14 produces a current $I_c$ on line 18. At the beginning of each system clock period integrator 22 produces an increasing voltage from current $I_c$ on line 26. At time $T_n$ the voltage on line 26 matches the reference voltage $V_n$ on line 34, and a signal is provided on line 42 for indicating that fact. The time $T_n$ that it takes for the voltage produced by integrator 22 to reach $V_n$ determines the delay from the start of the clock pulse and hence determines the point within the clock period where the timing marker is to be placed.

Because of production tolerances and variations in the operating environment, the charging current $I_c$, the reference voltage $V_n$ or the charging characteristics of integrator 22 may not be precise. For example, if the charging time of integrator 22 is smaller than expected, then, when a current $I_c$ (FIG. 2) is provided on line 18, a longer time $T_n$ elapses before the reference voltage $V_n$ is matched. On the other hand, if the charging rate of integrator 22 is faster than expected, then a charging current $I_c''$ causes the voltage on line 26 to increase much faster, and hence a shorter time $T_n''$ elapses before the reference voltage $V_n$ is matched. Consequently, the actual range of delay times $T_{n'}$ or $T_{n''}$ may vary significantly from the theoretical range of delay time $T_n$, and the circuit will not perform properly.

SUMMARY OF THE INVENTION

The present invention is directed to a method and apparatus for calibrating linear delay lines wherein the charging current provided by a range DAC is automatically adjusted to compensate for any variations from theoretical circuit operating parameters. In one embodiment of the present invention, a voltage generator generates a ramp voltage at first and second frequencies. A counter counts the number of cycles of the ramp voltages generated at the first and second frequencies, and, based on the difference in the number of ramp voltages counted, the rate of change or slope of the ramp voltage may be adjusted.

BRIEF DESCRIPTION OF THE DRAWINGS

FIG. 1 is a block diagram of a known delay circuit.

FIG. 2 is a graph showing voltage as a function of time and charging current for a linear delay line.

FIG. 3 is a block diagram of a calibrating circuit according to the present invention.

FIGS. 4A and 4B are two graphs showing waveforms produced by the integrators in the calibrating circuit according to the present invention.

DETAILED DESCRIPTION OF THE PREFERRED EMBODIMENTS

FIG. 3 is a block diagram of a linear delay circuit 50 which includes calibration circuitry according to the present invention. In this embodiment, a range DAC 54 receives an eight-bit digital word on bit lines 58 and produces therefrom a charging current $I_l$ on a line 62. The current on line 62 is communicated to an integrator 66 which typically includes a capacitance for converting the charging current from line 62 into a ramp voltage on line 70. The voltage on line 70 is communicated to one input terminal of a comparator 74. A delay DAC 78 receives an eight-bit digital word over bit lines 82 and produces therefrom a reference voltage on a line 86. The reference voltage on line 86 is communicated to the other input terminal of comparator 74. Comparator 74 compares the ramp voltage on line 70 with the reference voltage on line 86 and produces a time marker signal on a line 90 when the voltages match.

The time marker signal on line 90 is communicated to the reset input terminal of a flip-flop 94 for causing flip-flop 94 to assume a reset state. In this state a low signal appears on the Q output terminal of flip-flop 94 and a high signal appears on the $\overline{Q}$ output terminal of flip-flop 94. When flip-flop 94 is in the reset state, the high signal appearing at the $\overline{Q}$ output terminal of flip-flop terminal 94 is communicated to integrator 66 over a line 98 for discharging the capacitance in integrator 66 and hence reset the ramp voltage on line 70.

The Q output terminal of flip-flop terminal 94 is coupled to a line 102 which, in turn, is coupled to an integrator 106 and a programmable counter 108. Integrator 106 receives a fixed current $I_f$ on a line 110 and produces therefrom a ramp voltage on a line 114. Line 114 is coupled to one input terminal of a comparator 118. The other input terminal of comparator 118 is coupled to a line 122 for receiving a reference voltage $V_{ref}$. Comparator 118 compares the ramp voltage received on line 114 with the reference voltage received on line 122 and provides a time marker signal on a line 126 when the voltages match.

A control unit 130 controls calibration of the circuit. Control unit 130 receives a mode signal on a line 134 for placing circuit 50 in an automatic calibration mode. When in automatic calibration mode, control unit 130 provides signals to counter 108, to a counter/register 138 and to an AND gate 142 over lines 146, 150 and 156, respectively, for enabling the operation of these units. Additionally, control unit 130 couples the time marker signal from line 126 to a line 160 which, in turn, is connected to the set input terminal of flip-flop 94 for placing flip-flop 94 in a set state. When flip-flop 94 is in a set state, a high signal appears on line 102 for discharging the capacitance in integrator 106. As discussed below, flip-flop 94 is converted into a free-running multivibrator by control line 134.

Counter 108 is programmed to count N cycles of the oscillating frequency of flip-flop 94. While counter 108 is counting it provides a count signal over line 164. The count signal is used in conjunction with control signal line 156 for enabling AND gate 142. The control signals on line 156 enable the up/down counter register 138 to count the number of system clock pulses on line 166 during the period of the count signal on line 164 through the AND gate 142 over line 180. The contents of counter/register 138 are communicated to an adder 174 over bit lines 178. Adder 174 adds (or subtracts) the binary value on lines 178 to the original range DAC input value received from bit lines 182 and produces a new input value on lines 58. The value on lines 58 are looped back to lines 182 to provide an updated input value to adder 174.

In this embodiment, the system clock pulses received on line 166 are square wave pulses having a period $T_c$ of 3.2 nanoseconds. Since the delay DAC 78 receives an eight-bit word on line 82, the system clock period $T_c$ may be resolved into 256 units of 12.5 picoseconds each. Assume that integrator 66 produces a linear ramp voltage in response to the current $I_l$ from range DAC 54 and that $T_n$ is the calibrated time taken to integrate from $V_o$ to $V_n$ when the input of delay DAC 78 is set to n. Assume further that the input word on lines 82 to delay DAC 78 is set to 255 (hex FF) with $T_{255'}$ being the corresponding period. An objective of range calibration is to set the charging current $I_l$ (set by the range DAC) so that the voltage ramps created by integrator 66 take exactly 3.1875 nanoseconds to reach the reference voltage $V_{255}$ provided by delay DAC 78. When the delay line is calibrated, $T_{255'} = T_{255} = 3.1875$ nanoseconds, and $I_l = I_c$ where $I_c$ is the calibrated integrator current set by the range DAC 54.

Before calibration is achieved, $T_{255'}$ and $I_l$ can be written as $$T_{255} = T_{255'} + dT \tag{1}$$

$$I_c = I_l - dI_1 \tag{2}$$

For a linear integrator, $$T_{255'} = (V_{255} \times C_l)/I_l \tag{3}$$

where $C_l$ is the capacitance of the integrator, and $$T_c = (V_{256} \times C_l)/I_c = 3.2 \text{ nanoseconds} \tag{4}$$

Dividing equation 3 by equation 4, we have $$T_{255'}/T_c = (V_{255} \times I_c)/(V_{256} \times I_l) \tag{5}$$

Dividing equation 2 by $I_c$ we have $$I_l/I_c = (1 + dI_l/I_c) \text{ or}$$

$$I_c/I_l = (1 - dI_l/I_c) \tag{6}$$

Substituting equation 6 into equation 5, we obtain $$T_{255'}/T_c = (1 - dI_l/I_c) V_{255}/V_{256} \tag{7}$$

When circuit 50 is to be calibrated, flip-flop 94 is placed in a set state (Q high and $\overline{Q}$ low) for enabling integrator 66 to charge in response to the charging current $I_l$ on line 62. The input to delay DAC 78 is set to 255 for providing the voltage $V_{255}$ to comparator 74. Operation of the circuit then proceeds as shown in FIG. 4A. At time $T_1$, integrator 66 begins to charge, and the voltage on line 70 linearly varies from $V_0$ to $V_{255}$ as shown in the upper waveform of FIG. 4A. At time $T_2$, the voltage on line 70 matches the reference voltage $V_{255}$, and a signal is provided on line 90 for resetting flip-flop 94. After a propagation delay represented by an interval $T_{d1}$ between time $T_2$ and time $T_3$, a high signal is provided on line 98 for discharging the capacitance in integrator 66. On the other hand, the low signal on line 102 allows integrator 106 to begin charging in response to the fixed current received on line 110 as shown in the lower waveform of FIG. 4A. At time $T_4$, the voltage appearing on line 114 matches the reference voltage $V_{ref}$ on line 122, and a time marker signal is produced on line 126. When in calibration mode, control unit 130 couples the signal on line 126 to line 160 for setting flip-flop 94. As with the operation of integrator 66, there is a time delay $T_{d1}$ between times $T_4$ and $T_5$ before flip-flop 94 sets. In this embodiment, $V_{ref}$ is chosen so that the interval $T_{w1}$ between times $T_3$ and $T_5$ is sufficient to allow the capacitance in integrator 66 to completely discharge, so that no duty cycle error is introduced into the calibration.

After flip-flop 94 is set, a high signal appears on line 102 for discharging integrator 106 and for incrementing counter 110. The process continues for a prescribed number of cycles (e.g. 1024) of the waveform. At the same time, counter/register 138 counts the number of system clock pulses which appear on line 166. Therefore, the total count in counter/register 138 after N cycles will be $$K_1 = (T_{255'} + T_{d1} + T_{w1}) \times N/T_c \tag{8}$$

Next, the input to the delay DAC is set to 127, and the waveforms shown in FIG. 4B are produced. Once again, system clock pulses are counted over N cycles of the waveform, and the total count $K_2$ is $$K_2 = (T_{127'} + T_{d2} + T_{w2}) \times N/T_c \tag{9}$$

$T_{d1} = T_{d2}$ because these values are set by loop delay through integrator 66, comparator 74 and flip-flop 94. Additionally, $T_{w1} = T_{w2}$ because these values are set by loop delay through integrator 106, comparator 118 and flip-flop 94. Thus, subtracting equation 9 from equation 8, we have $$(K_1 - K_2) = (T_{255'} - T_{127'}) \times N/T_c$$

Since the integrator is linear, $$T_{255'} - T_{127'} = T_{128'}, T_{256'} = 2 \times T_{128'}, \text{ and}$$

$$T_{256'}/T_c = 2(K_1 - K_2)/N \tag{10}$$

For a linear ramp,
$$T_{256'}/T_c = (V_{256} \times T_{255'})/V_{255} \times T_c)$$
hence,
$$2(K_1 - K_2)/N = (V_{256}/V_{255}) \times (T_{255'}/T_c) \tag{11}$$

Substituting equation 7 into equation 11, we obtain $$2(K_1-K_2)/N = 1 - dI_l/I_c \text{ or}$$

$$dI_l/I_c = (N - 2K_1 + 2K_2)/N = 2dK/N \quad (12)$$

where $dK = (N/2 - K_1 + K_2)$

In order to provide the value of dK in counter/register 138, it is necessary to preload counter/register 138 with the value N/2, subtract the number of system clock pulses counted with delay DAC 78 set to 255, and then add the number of system clock pulses counted while delay DAC 78 is set to 127. This may be accomplished by using two's compliment notation and causing counter/register 138 to count up and then down.

Once the value of dK is obtained, it may be necessary to scale the number depending on the input sensitivity of range DAC 54. In this embodiment, an eight-bit range DAC 78 is used to provide an adjustment range of $\pm r\%$ in the charging current $I_l$ for integrator 66. "r" should be chosen to cover for variations in $I_l$ due to process or other tolerances. The range DAC 54 is therefore capable of providing a current adjustment range of $(2r \times I_b)$ where $I_b$ is the bias charging current (typically 220 microamps), and $$(1+r)I_b = I_l \quad (13)$$

For an eight-bit range DAC, one least significant bit (LSB) of the range DAC provides a current increment of $$1\text{lsb} = 2rI_b/(2^{}8) \text{ microamps } 2rI_l/[(1+r)2^{}8] \quad (14)$$

If the same current $I_l$ is input to delay DAC 78, then 1lsb of range DAC 54 equals $2r/(1+r)$ LSB of the current in delay DAC 78 used to create the voltage on line 86.

Since $I_c$ is approximately equal to $I_l$, substitution of equation (13) into equation 12 results in $$dI_l/(1+r)I_b = 2dK/N, \text{ or}$$

$$dI_l/rI_b = 2(1+r) \, dK/rN \quad (15)$$

Since $rI_b$ is half range of the eight-bit range DAC 54, it can be expressed as an input value of $2^{}7$ units, and $$dI_l = 2^{}8 \times (1+r)dK/rN$$

If $N = 2^{}n$ for $n = 0, 1, 2$, etc., then $$dI_l = dK(1+r)/[r \times 2^{}(n-8)] \quad (16)$$

For ease of implementation, $dI_l$ may be chosen as binary multiples of dK such that
$$dI_l = 2^{**}m \times dK \quad (17)$$

where $m = 0, 1, 2$ etc. Consequently, $$(1+r)/(r \times 2^{**}(n+m-8)) = 1 \quad (18)$$

The properly scaled correction term in equation 17 (formed by shifting the contents of the value of dK in register 138) can be added directly to the range input data on line 182 by adder 174 for successive iterations to achieve automatic calibration. In this embodiment, $(n+m) = 10$ for equation 15, which yields a resolution $\pm \frac{1}{4}$ lsb of the delay DAC current, and an adjustment range of $\pm 33\%$ of the delay DAC current.

Successive iterations are performed over a few calibration cycles until the correction factor (dK) in the up/down counter 138 vanishes to zero. This guarantees system calibration. The calibration circuit according to the present invention adds less than two-hundred gates to the circuit shown in FIG. 1 and provides for automatic generation of the current correction factor in binary form. Calibration is independent of random noise, systematic noise, and timing jitter, since these effects are averaged over N (typically 512 or 1024) cycles. Calibration is independent of signal propagation delays ($T_{d1}$, $T_{d2}$), and discharging characteristics ($T_{w1}$ and $T_{w2}$) and nonlinearity of the ramp generators. Nonlinearity in the linear portion of the ramp will only affect the linearity of timing resolution, but not range calibration. The circuit configuration and functionality of the linear delay line is unaffected by whether the delay line is in calibration or normal mode. As a result, systemic errors are eliminated.

While the above is a complete description of a preferred embodiment of the present invention, various modifications may be employed. For example, the amount of hardware may be further reduced by accumulating the results of a number of up/down counting sequences per iteration with shorter counters. Consequently, the scope of the invention should not be limited except as described in the claims.

What is claimed is:

1. A calibrating circuit comprising:
   first voltage generating means for generating a first ramp voltage;
   oscillating means, coupled to the first voltage generating means, for causing the first voltage generating means to generate the first ramp voltage periodically at a first frequency in response to a first reference voltage, and for causing the voltage generating means to generate the first ramp voltage periodically at a second frequency in response to a second reference voltage;
   ramp counting means, coupled to the first voltage generating means, for counting a selected number of first ramp voltages generated at the first and second frequencies; and
   rate adjusting means, coupled to the first voltage generating means and to the ramp counting means, for adjusting the rate of change of the first ramp voltage in response to the number of first ramp voltages counted by the counting means.

2. The circuit according to claim 1 wherein the oscillating means comprises:
   first comparing means, coupled to the first voltage generating means, for comparing the first ramp voltage to the first and second reference voltages and for generating respective first and second time marker signals when the first ramp voltage substantially matches the first and second reference voltages; and
   reference voltage means, coupled to the first comparing means, for selectively providing the first and second reference voltages to the comparing means.

3. The circuit according to claim 2 wherein the oscillating means further comprises:
   state switching means, coupled to the first comparing means, for assuming a first state in response to the first and second timing marker signals; and
   state altering means, coupled to the state switching means for providing a state altering signal to the state switching means for causing the state switching means to assume a second state.

4. The circuit according to claim 3 wherein the oscillating means further comprises first voltage reset means, coupled to the state switching means and to the first voltage generating means, for resetting the first ramp voltage when the state switching means assumes the first state.

5. The circuit according to claim 4 wherein the first voltage generating means comprises an integrator for receiving a first current and for generating the first ramp voltage in response to the first current.

6. The circuit according to claim 5 wherein the integrator comprises a capacitance which charges in response to the first current for generating the first ramp voltage.

7. The circuit according to claim 6 wherein the first voltage reset means comprises discharge means, coupled to the capacitance, for discharging the capacitance when the state switching means assumes the first state.

8. The circuit according to claim 7 wherein the first voltage generating means further comprises a digital-to-analog converter for generating the first current in response to a digital word.

9. The circuit according to claim 8 wherein the reference voltage means further comprises a digital-to-analog converter for selectively generating the first and second reference voltages in response to a digital word.

10. The circuit according to claim 3 wherein the state altering means further comprises:
    second voltage generating means for generating a second ramp voltage; and
    second comparing means, coupled to the second voltage generating means, for comparing the second ramp voltage to a third reference voltage and for generating the state altering signal when the second ramp voltage substantially matches the third reference voltage.

11. The circuit according to claim 10 wherein the oscillating means further comprises:
    first voltage reset means, coupled to the state switching means and to the first voltage generating means, for resetting the first ramp voltage when the state switching means assumes the first state; and
    second voltage reset means, coupled to the state switching means and to the second voltage generating means, for resetting the second ramp voltage when the state switching means assumes the second state.

12. The circuit according to claim 11 wherein the first voltage generating means comprises a first integrator for receiving a first current and for generating the first ramp voltage in response to the first current, and wherein the second voltage generating means comprises a second integrator for receiving a second current for generating the second ramp voltage in response to the second current.

13. The circuit according to claim 12 wherein the first integrator comprises a first capacitance which charges in response to the first current for generating the first ramp voltage, and wherein the second integrator comprises a second capacitance which charges in response to the second current for generating the second ramp voltage.

14. The circuit according to claim 13 wherein the first voltage reset means comprises first discharge means, coupled to the first capacitance, for discharging the first capacitance when the state switching means assumes the first state, and wherein the second voltage reset means comprises second discharge means, coupled to the second capacitance, for discharging the second capacitance when the state switching means assumes the second state.

15. The circuit according to claim 14 wherein the first voltage generating means further comprises a first digital-to-analog converter for selectively generating the first ramp voltage in response to a digital word.

16. The circuit according to claim 15 wherein the reference voltage means further comprises a second digital-to-analog converter for selectively generating the first and second reference voltages in response to a digital word.

17. The circuit according to claim 1 wherein the counting means further comprises:
    first frequency counting means, coupled to the first voltage generating means, for counting a prescribed number of first ramp voltages generated at the first frequency; and
    second frequency counting means, coupled to the first voltage generating means, for counting the prescribed number of first ramp voltages generated at the second frequency.

18. The circuit according to claim 17 further comprising:
    clock means for providing clock signals at a prescribed rate;
    first clock counting means, coupled to the clock means and to the first frequency counting means, for counting a number of clock pulses that occur while the first frequency counting means counts the prescribed number of first ramp voltages generated at the first frequency; and
    second clock counting means, coupled to the clock means and to the second frequency counting means, for counting a number of clock pulses that occur while the second frequency counting means counts the prescribed number of first ramp voltages generated at the second frequency.

19. The circuit according to claim 18 wherein the rate adjusting means adjusts the rate of change of the first ramp voltage in response to a difference between the number of clock pulses counted by the first clock counting means and the number of clock pulses counted by the second clock counting means.

20. The circuit according to claim 19 wherein the oscillating means comprises:
    first comparing means, coupled to the first voltage generating means, for comparing the first ramp voltage to the first and second reference voltages and for generating respective first and second time marker signals when the first ramp voltage substantially matches the first and second reference voltages; and
    reference voltage means, coupled to the comparing means, for selectively providing the first and second reference voltages to the comparing means.

21. The circuit according to claim 20 wherein the oscillating means further comprises:
    a flip-flop, coupled to the first comparing means, for emitting a first state signal in response to the first and second timing marker signals; and
    state altering means, coupled to the flip-flop, for providing a state altering signal to the flip-flop for causing the flip-flop to emit a second state signal.

22. The circuit according to claim 21 wherein the state altering means further comprises:
    second voltage generating means for generating a second ramp voltage; and
    second comparing means, coupled to the second voltage generating means, for comparing the second ramp voltage to a third reference voltage and for generating the state altering signal when the second ramp voltage substantially matches the third reference voltage.

23. The circuit according to claim 22 wherein the oscillating means further comprises:
   first voltage reset means, coupled to the flip-flop and to the first voltage generating means, for resetting the first ramp voltage in response to the first state signal; and
   second voltage reset means, coupled to the flip-flop and to the second voltage generating means, for resetting the second ramp voltage in response to the second state signal.

24. The circuit according to claim 23 wherein the first voltage generating means comprises a first integrator for receiving a first current and for generating the first ramp voltage in response to the first current, and wherein the second voltage generating means comprises a second integrator for receiving a second current for generating the second ramp voltage in response to the second current.

25. The circuit according to claim 24 wherein the first integrator comprises a first capacitance which charges in response to the first current for generating the first ramp voltage, and wherein the second integrator comprises a second capacitance which charges in response to the second current for generating the second ramp voltage.

26. The circuit according to claim 25 wherein the first voltage reset means comprises first discharge means, coupled to the first capacitance, for discharging the first capacitance in response to the first state signal, and wherein the second voltage reset means comprises second discharge means, coupled to the second capacitance, for discharging the second capacitance in response to the second state signal.

27. The circuit according to claim 26 wherein the first voltage generating means further comprises a first digital-to-analog converter for selectively generating the first ramp voltage in response to a digital word.

28. The circuit according to claim 27 wherein the reference voltage means further comprises a digital-to-analog converter for selectively generating the first and second reference voltages in response to a digital word.

29. The circuit according to claim 28 wherein the oscillating means further comprises mode setting means, coupled to the second comparator and to the flip-flop, for selectively coupling and decoupling the state altering signal to the flip-flop in response to a mode signal.

30. A method for calibrating a circuit comprising the steps of:
   generating a first ramp voltage periodically at a first frequency in response to a first reference voltage;
   generating the first ramp voltage periodically at a second frequency in response to a second reference voltage;
   counting a number of first ramp voltages generated at the first and second frequencies; and
   adjusting the rate of change of the first ramp voltage in response to the number of first ramp voltages counted.

31. The method according to claim 32 wherein the counting step further comprises the step of:
   counting a prescribed number of first ramp voltages generated at the first frequency; and
   counting the prescribed number of first ramp voltages generated at the second frequency.

32. The method according to claim 31 wherein the counting step further comprises the step of:
   providing clock signals at a prescribed rate;
   counting a first number of clock signals that occur while the prescribed number of first ramp voltages generated at the first frequency are being counted; and
   counting a second number of clock signals that occur while the prescribed number of first ramp voltages generated at the second frequency are being counted.

33. The method according to claim 32 wherein the adjusting step further comprises the step of adjusting the first ramp voltage in response to a difference between the first and second number of clock signals counted.

* * * * *